United States Patent [19]

Ng et al.

[11] Patent Number: 4,761,730

[45] Date of Patent: Aug. 2, 1988

[54] COMPUTER MEMORY APPARATUS

[75] Inventors: Alvan W. Ng, Lowell; Edwin P. Fisher, N. Abington, both of Mass.

[73] Assignee: Honeywell Bull Inc., Waltham, Mass.

[21] Appl. No.: 751,179

[22] Filed: Jul. 2, 1985

[51] Int. Cl.$^4$ ............................................. G06F 13/00
[52] U.S. Cl. ................................................... 364/200
[58] Field of Search ... 364/200 MS File, 900 MS File; 365/222, 230

[56] References Cited

U.S. PATENT DOCUMENTS

| | | | |
|---|---|---|---|
| 4,174,537 | 11/1979 | Chu et al. | 364/200 |
| 4,319,324 | 3/1982 | Johnson et al. | 364/200 |
| 4,323,965 | 4/1982 | Johnson et al. | 364/200 |
| 4,361,869 | 11/1982 | Johnson et al. | 364/200 |
| 4,628,489 | 12/1986 | Ong et al. | 365/230 |

Primary Examiner—Gareth D. Shaw
Assistant Examiner—Debra A. Chun
Attorney, Agent, or Firm—Faith F. Driscoll; John S. Solakian

[57] ABSTRACT

A memory subsystem couples to a bus in common with and proceses memory requests received therefrom. The subsystem includes a single addressable memory module unit or stack having a number of word blocks of dynamic random access memory (DRAM) chips mounted on a single circuit board which connects to the remainder of the subsystem through a single word wide interface. Chip select circuits preselect a pair of blocks of RAM chips from the stack. Timing circuits generate a plurality of sequential column address pulses which are selectively applied to the preselected blocks of chips within an interval defined by a row address pulse. This results in the sequential read out of a pair of words from the preselected blocks of the single word wide module into a pair of subsystem data registers. For each memory read request, the words from each preselected pair of blocks are read out in sequence providing a double fetch capability without any loss in system performance.

21 Claims, 4 Drawing Sheets

COMPUTER MEMORY APPARATUS

BACKGROUND OF THE INVENTION

1. Field of Use

This invention relates to memory systems containing semiconductor memory elements including those in which stored information must be periodically refreshed to preserve the integrity of such information.

2. Prior Art

It is well known to construct memory systems from a number of memory modules. In certain prior art systems, memory modules are paired together to provide a double word fetch access capability. The term double word fetch access as used herein refers to the capability of being able to access a pair of words at a time from a memory system during a cycle of operation. This type of system is described in U.S. Pat. No. 4,236,203, assigned to the same assignee as named herein.

In the above prior art system, the memory system connects to an asynchronously operated single word wide system bus. In the arrangement, a request for multiple words is made in a single bus cycle and the requested information words are delivered to the bus over a cycle of operation which consists of a series of response cycles.

It will be noted that in such double word fetch memory module systems, it is necessary to generate and decode even and odd addresses for accessing both memory modules. Such an arrangement for accomplishing the required address generation/decoding is described in U.S. Pat. No. 4,185,323 which is assigned to the same assignee as named herein.

In the above arrangement, the low order bits of the address provided with the memory request specify the storage location being accessed while the high order bits specify which pair of rows DRAM chips is being selected.

The address arrangement includes a primary address register which also served as a counter and two parallel secondary address registers. In carrying out a double fetch operation, the initial address was loaded into the primary address register and then stored in the appropriate secondary address register. Then the memory subsystem, after signalling it was busy, incremented the initial address contents of the primary address register by one and the resulting address was then stored in the other secondary address register. Because of the additional time required to generate the second address, the memory timing circuits included circuits for generating two sets of clocking signals and for steering the sets of clocking signals to the appropriate memory module units. This was necessary to enable the read out of the pair of words into the subsystem data output registers in time for transfer to the bus.

To reduce this additional time, another arrangement employed sequential chip select decode apparatus which would provide a pair of decodes according to the least significant address bits for simultaneously accessing a pair of words from even and odd memories. A system which utilizes this arrangement is disclosed in U.S. Pat. No. 4,323,965 which is also assigned to the same assignee as named herein. While the system provided a double fetch capability with less circuits than the prior art, it still required circuits for accessing at least a pair of memories. Moreover, as the capacities of these memories become more dense, it becomes desirable to provide the double fetch memory in smaller increments. However, this is not possible in those prior art systems which provide a double fetch capability.

Accordingly, it is a primary object of the present invention to provide a low cost memory subsystem which incorporates a double fetch capability.

It is a further object of the present invention to provide a double fetch memory subsystem which can be implemented with a minimum of circuits.

SUMMARY OF THE INVENTION

The above and other objects are achieved in a preferred embodiment of the memory subsystem of the present invention which couples to a bus in common with a central processing unit and processes memory requests received therefrom. The subsystem includes a single addressable memory module unit which operatively couples to the single word bus. The memory module unit, or stack includes a number of word blocks of dynamic random access memory (DRAM) chips mounted on a single circuit board which connects to the subsystem data registers through a single word wide interface. The subsystem utilizes chip select decode apparatus which preselects two blocks of RAM chips from the stack for enabling by a row address timing signal generated by the timing circuits.

According to the present invention, the timing circuits provide a plurality of sequential column address timing signals within an interval defined by the row address timing signal. Additionally, selection circuits are connected to apply each of the column timing signals to a different set of preselected word blocks of RAM chips for sequentially reading out a plurality of words from the single stack into a corresponding number of data registers. Each of the data registers is connected to be conditioned by a different predetermined one of column address timing signals to store a different one of the plurality of words in the same sequence for each memory read request. That is, the first word accessed is always stored in a first one of the registers, the second word in a second one of the registers. Accordingly, there is no need to include additional logic circuits for selecting which data register is to receive the first word, or second word. Thereafter, under the control of the timing circuits, the data registers are conditioned to transfer the plurality of words to a central processing unit over a corresponding number of successive bus cycles of operation.

The result is that the subsystem of the present invention can be constructed at low cost and with a minimum of circuit complexity without any loss of system performance. That is, only a single word wide interface is required to provide the required memory capacity allowing for memory expansion. This facilitates maintenance and increases system reliability.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

DESCRIPTION OF THE PREFERRED EMBODIMENT

Figure 1:
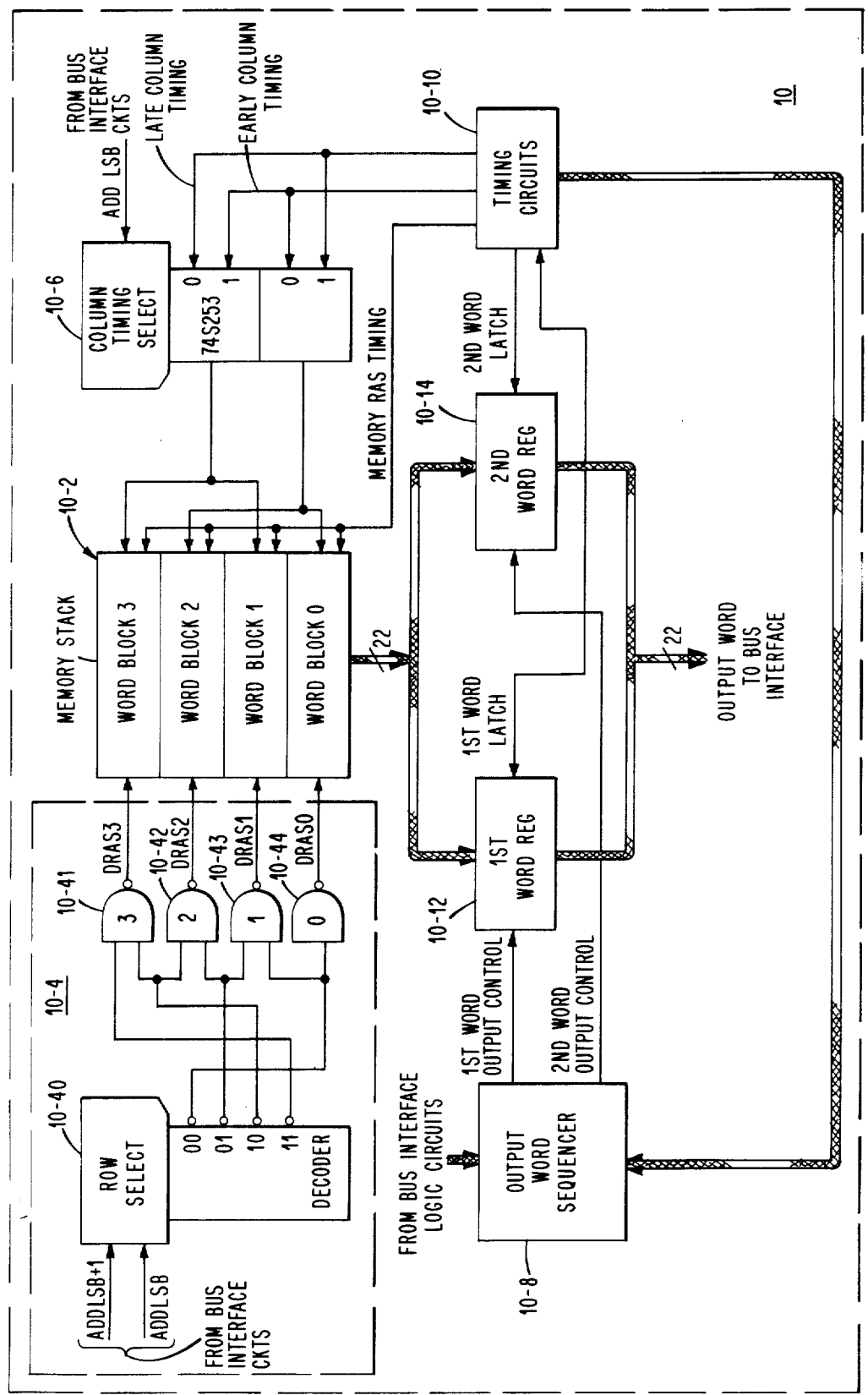
FIG. 1 shows in block diagram form a system which incorporates the principles of the present invention.

FIG. 1 shows in block diagram form, memory subsystem 10 constructed according to the principles of the present invention. As seen from FIG. 1, the subsystem 10 includes a single memory module unit or stack 10-2, the decode and select circuits of block 10-4, a column timing select circuit 10-6, an output word sequencer 10-8, the timing circuits of block 10-10 and a pair of data registers 10-12 and 10-14. The memory stack 10-2 includes four word blocks of 256K dynamic MOS RAM chips mounted on a single printed circuit board. Each word is 22 bits.

The decode and select circuits of block 10-4 in response to least significant bit address signals ADDLSB and ADDLSB+1 of the memory address of each memory request operate to select a pair of words from two of the memory blocks. The circuits include a binary decoder circuit 10-40 and a plurality of NAND gates 10-41 through 10-44 which connect to the 00 through 11 decode outputs as shown. Each of the NAND gates 10-41 through 1-44 generate a different one of the row address strobe signals DRAS0 through DRAS3 which are applied to the 256K DRAM chips of a corresponding one of the word blocks. Within the stack of each of the signals DRAS0 through DRAS3 are logically ANDed with a memory row address timing signal MEMRAS from timing circuits 10-10 and applied to the row address strobe (RAS) input terminals of the 256K DRAM chips. The least significant bit address signals ADDLSB and ADDLSB+1 are decoded as follows:

| ADDRESS VALUES | | BLOCK SELECTED |
| --- | --- | --- |
| ADDLSB+1 | ADDLSB | BY ROW STROBE |
| 0 | 0 | 0 & 1 |
| 0 | 1 | 1 & 2 |
| 1 | 0 | 2 & 3 |
| 1 | 1 | 3 only. |

Additionally, the memory stack 10-2 receives early column timing and late column timing signals from a selector circuit 10-6 in response to least significant address bit signal ADDLSB. That is, when bit signal ADDLSB is a binary ZERO, the "0" inputs are selected to be applied as outputs. When signal ADDLSB is a binary ONE, the "1" inputs are selected as outputs. The early column and late column timing signals are applied to the column address strobe (CAS) input terminals of the 256K DRAM chips. It will be noted that one selector output is applied to the chips of blocks 0 and 2 while the other output to the chips of blocks 0 and 2 while the other output is applied to the chips of blocks 1 and 3. The circuit 10-6 is constructed from selector circuits such as those designated as 74S253 manufactured by Texas Instruments Incorporated.

The memory words read out from stack 10-2 are stored in the first word and second word registers 10-12 and 10-14 in response to latch timing signals from the circuits 10-10. The circuits of the output word sequencer 10-8 controls the transfer of the contents of the registers 10-12 and 10-14 in response to timing signals from circuits 10-10 and from bus interface logic circuits, not shown.

Figure 2:
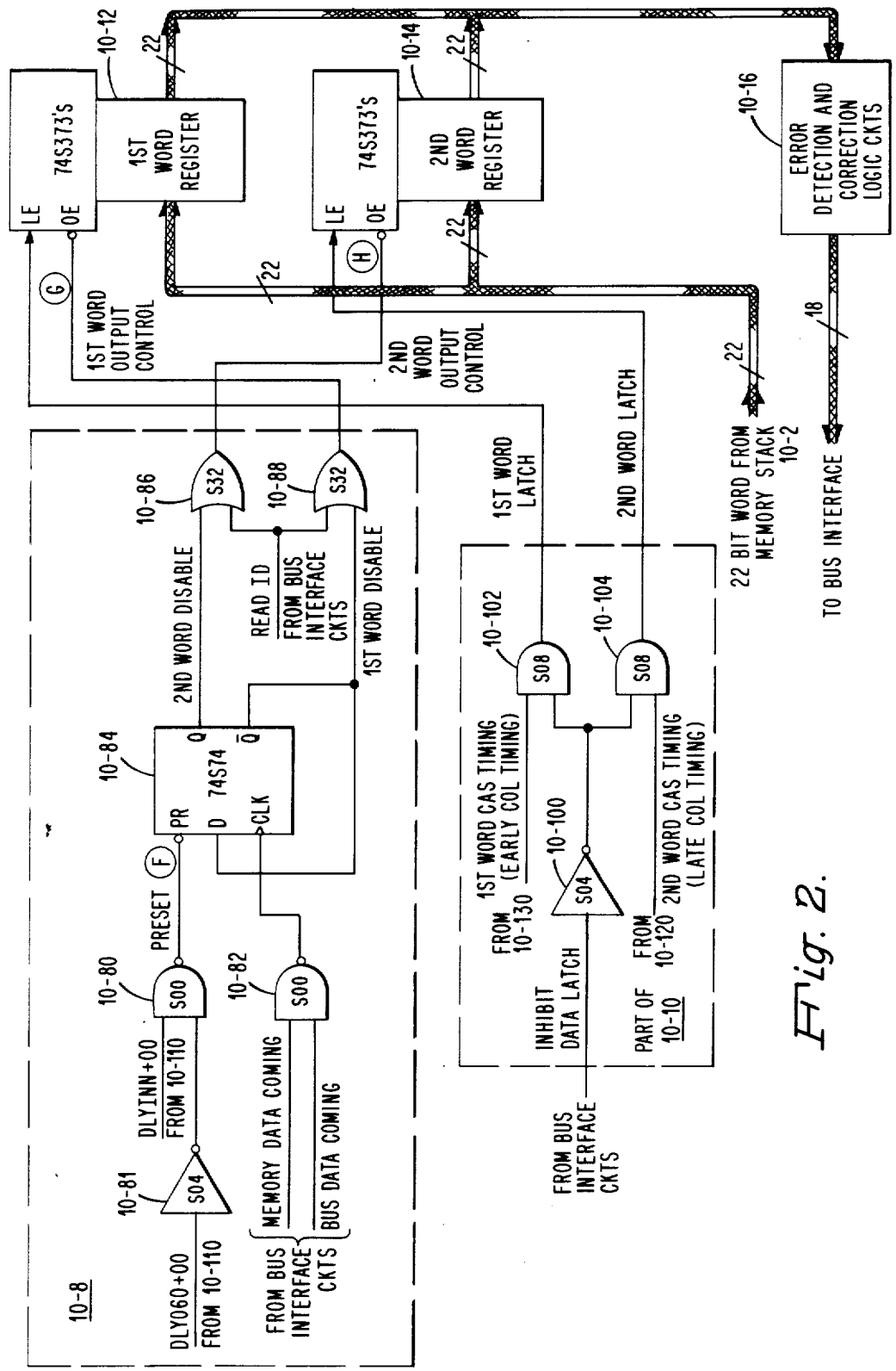
FIGS. 2 and 3 show in greater detail the memory subsystem of FIG. 1.

FIG. 2 shows in greater detail, the first and second word registers 10-12 and 10-14 and associated control and timing circuits. Both registers are constructed from D-type transparent latch circuits, such as those designated as SN74S373, manufactured by Texas Instruments Incorporated. As shown, the registers 10-12 and 10-14 have their data input terminals connected in common to receive the 22-bit word from memory stack 10-2. Their output terminals connect in common to bus interface circuits via error detection and correction logic circuits, conventional in design as, for example, such as those in U.S. Pat. No. 4,072,853.

Additionally, each of the registers 10-12 and 10-14 has a latch enabling terminal (LE) and output enabling terminal (OE). When terminal LE is forced to a binary ONE, this enables the signals at the data input terminals to be latched into the register. When terminal OE is forced to a binary ZERO, this allows the latched signals to be applied to the output terminals of the register. This operation is independent of the latching action of the register flip-flops.

As shown, the signals applied to the LE and OE input terminals of registers 10-12 and 10-14 are provided by the associated control and timing circuits of blocks 10-8 and 10-10, respectively. The portion of the timing circuits shown generate the first and second word latch signals which load registers 10-12 and 10-14 in a predetermined desired sequence. In greater detail, the timing circuits include an input inverter 10-100 and a pair of AND gates 10-102 and 10-104 connected as shown.

During a read memory cycle, when an inhibit data latch signal is a binary ZERO, the partially conditioned AND gates 10-102 and 10-104 apply first and second word CAS timing signals, respectively, to the LE terminals of the registers 10-12 and 10-14. This permits first and second data words to be latched into registers 10-12 and 10-14, respectively. In those instances when the INHIBIT DATA LATCH signal is a binary ONE, both AND gates 10-102 and 10-104 are disabled preventing any latching action from taking place.

The control circuits are the output word sequencer 10-8 which includes a pair of input NAND gates 10-80 and 10-82, an inverter 10-81, a D-type flip-flop 10-84 and a pair of output OR gates 10-86 and 10-88 connected as shown. The NAND gate 10-80 in response to timing signals DLYINN+00 and DLY060+00 generates a negative going 60 nanosecond pulse. This pulse is applied to a preset input terminal of flip-flop 10-84 which results in it being switched to a binary ONE state. When preset, flip-flop 10-84 forces SECOND WORD DISABLE signal to a binary ONE and a FIRST WORD DISABLE signal to a binary ZERO. The binary ZERO signal is applied via OR gate 10-88 to the output enable (OE) terminal of register 10-12. This enables the first word to be transferred to the bus interface via error detection and correction logic circuits of block 10-16. At the end of sending out the first word, NAND gate 10-82, in response to signals MEMORY DATA COMING and BUS DATA COMING being forced to binary ZEROS, produces a positive going signal at a clock input terminal CK which resets flip-flop 10-84 to a binary ZERO. This forces the SECOND DOUBLE WORD DISABLE signal to a binary ZERO. The binary ZERO signal is applied via OR gate 10-86 to the output enable (OE) terminal of register 10-14. Thereafter, in the case of a double word fetch, this enables a second word to be transferred to the bus interface.

Additionally, the word sequencer 10-8 allows address ID information to be received from the bus interface during a read operation. At that time, signal READ I.D. is forced to a binary ONE which causes sequencer 10-8 to force both the first and second output control signals to binary ONES preventing any signals from being applied to the interface by registers 10-12 and 10-14.

Both the control and timing circuits are constructed from conventional integrated circuits, such as those designated in FIG. 2 (e.g. 74S00, 74S74, 74S08, 74S32, etc.), manufactured by Texas Instruments Inc.

Figure 3:
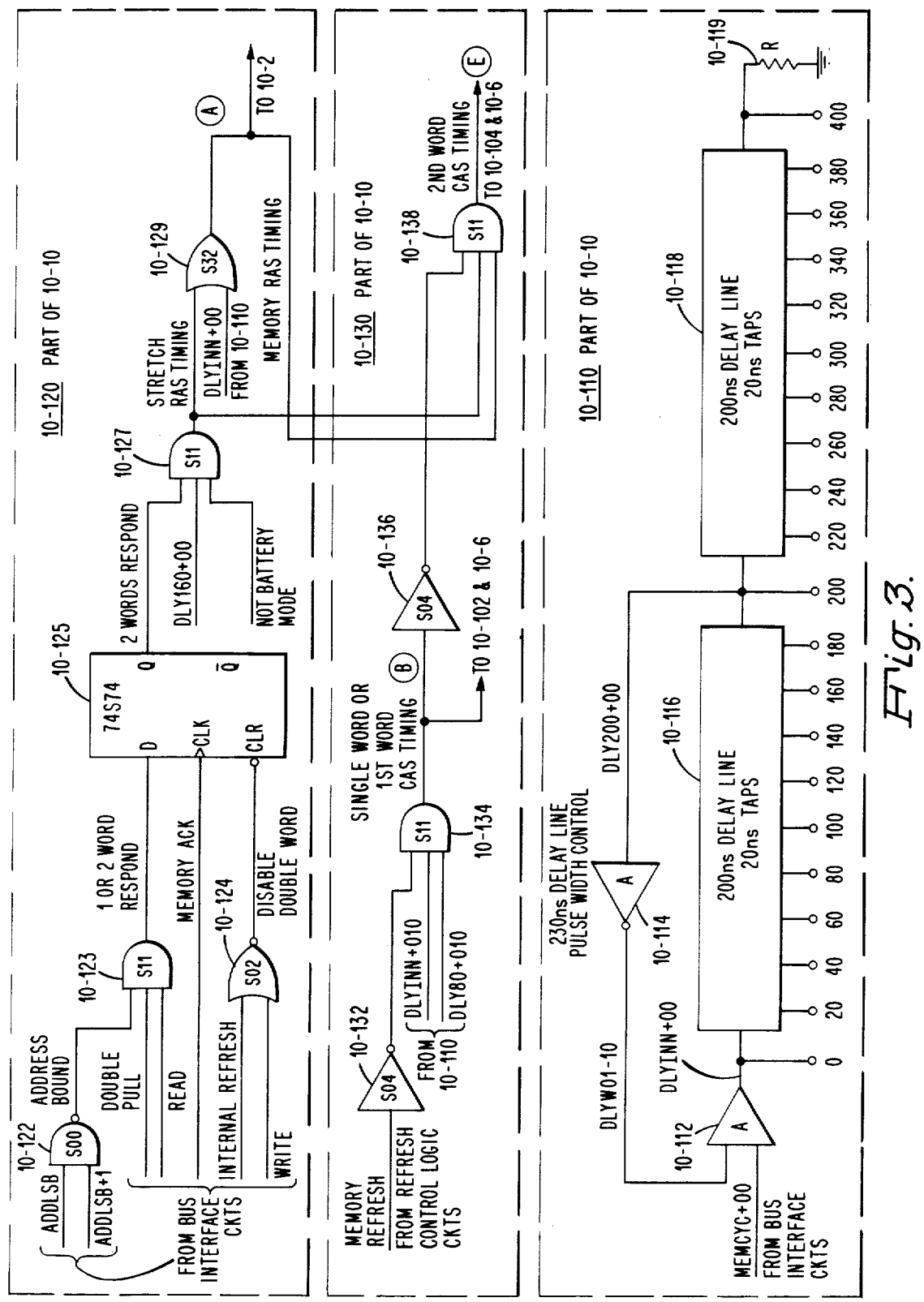

FIG. 3 shows in greater detail, the remaining circuits of blocks 10-10. As seen from the Figure, these circuits include delay line generator circuits 10-110, row address strobe (RAS) timing circuits 10-120 and column address strobe (CAS) timing circuits 10-130. The circuits 10-110 include an AND gate amplifier circuit 10-112, an inverter circuit 10-114 and a pair of connected 200 nanosecond delay lines 10-116 and 10-118 which are resistively terminated at one end by a resistor 10-119. The generator circuits 10-110 generate a sequence of timing pulses DLYINN+00 through DLY400+00 in response to a memory cycle signal MEMCYC+00 which are applied to a series of output taps labeled 0 through 400, respectively.

When signal DLY200+00 is generated at an output tap, it is also applied to inverter 10-114. The inverted signal DLYW01-10 is fed back by inverter 10-114 to amplifier 10-112 forcing signal DLYINN+00 to a binary ZERO. In this manner, inverter 10-114 establishes a 230 nanosecond width for signal DLYINN+00.

Timing signal DLYINN+00 along with signal DLY160+00 are applied to the RAS timing circuits 10-120. These circuits include gates 10-122 through 10-124, 10-127 and 10-129, in addition to a D-type flip-flop 10-125 which are connected as shown. The NAND gate 10-122 forces its output signal ADDRESS BOUND to a binary ZERO when both low order address signals ADDLSB and ADDLSB+1 are binary ONES. This inhibits AND gate 10-123 from switching flip-flop 10-125 to a binary ONE when clocked by a MEMORY ACKNOWLEDGE signal. In the absence of an address boundary condition AND gate 10-123 switches flip-flop 10-125 to a binary ONE in response to a double fetch/pull memory read request (i.e., when both signals DOUBLEPULL and READ are ONES) when the MEMORY ACKNOWLEDGE signal goes positive. The NOR gate 10-124 forces or clears flip-flop 10-125 to a binary ZERO state during an internal refresh or write cycle of operation (i.e., when signal INTERNAL REFRESH or WRITE is a binary ONE).

The binary ONE output signal TWO WORDS RESPOND condition AND gate 10-127 to force output signal STRETCH RAS TIMING to a binary ONE in response to timing signal DLY160+00 when the subsystem is not operating under battery power (i.e., when signal NOT BATTERY MODE is a binary ONE). The STRETCH RAS TIMING signal conditions OR gate 10-129 to extend the length of time that its output signal is a binary ONE.

The MEMORY RAS TIMING signal in addition to being applied to the 256K DRAM chips of stack 10-2 is also applied to the CAS timing circuits 10-130. These circuits also receive the STRETCH RAS TIMING signal from the circuits 10-120, timing signals DLYINN+00 and DLY80+00 from circuits 10-110 and MEMORY REFRESH signal from the refresh control circuits. The circuits 10-130 include series connected inverters 10-132 and 10-136 and AND gates 10-134 and 10-138. In the absence of a memory refresh cycle (i.e., when signal MEMORY REFRESH is a ZERO), AND gate 10-134 forces FIRST WORD CAS TIMING signal to a binary ONE in response to timing signals DLYINN+00 and DLY80+00. In addition to being applied to circuits 10-102 and 10-6, the first word CAS timing signal is inverted by inverter 10-136 and applied as inhibiting input to AND gate 10-138.

At the termination of the FIRST WORD CAS TIMING signal, AND gate 10-138 forces the SECOND WORD CAS TIMING signal to a binary ONE in response to signals STRETCH RAS TIMING and MEMORY RAS TIMING. The SECOND WORD CAS TIMING signal is applied to circuits 10-104 and 10-6. Both the RAS and CAS timing circuits 10-120 and 10-130 are constructed from conventional integrated circuits such as those designated in FIG. 3 (e.g. 74S00, 74S11, 74S74, etc.) manufactured by Texas Instruments Inc.

DESCRIPTION OF OPERATION

With reference to the timing diagrams of FIGS. 4a and 4b, the operation of the preferred embodiment of the present invention disclosed in FIGS. 1 through 3 will now be described. It will be understood that the memory subsystem 10 of FIG. 1 can process a variety of memory requests including both single word and double word fetch requests. When a single or double word fetch request is received, this causes the bus interface circuits to generate a number of signals in the desired sequence required for processing that type of request. These signals include the control signals READ I.D., MEMCYC+00, DOUBLE PULL (double fetch only), READ and MEMORY ACKNOWLEDGE, MEMORY DATA COMING and BUS DATA COMING.

In addition to the interface signals mentioned, the subsystem receives address signals ADDLSB and ADDLSB+1 from the bus interface which corresponds to the two least significant address bits of the memory address portion of the request. For the purposes of the present invention, the interface circuits can be considered conventional in design and for example are similar to those circuits disclosed in U.S. Pat. No. 4,185,323.

Figure 4:
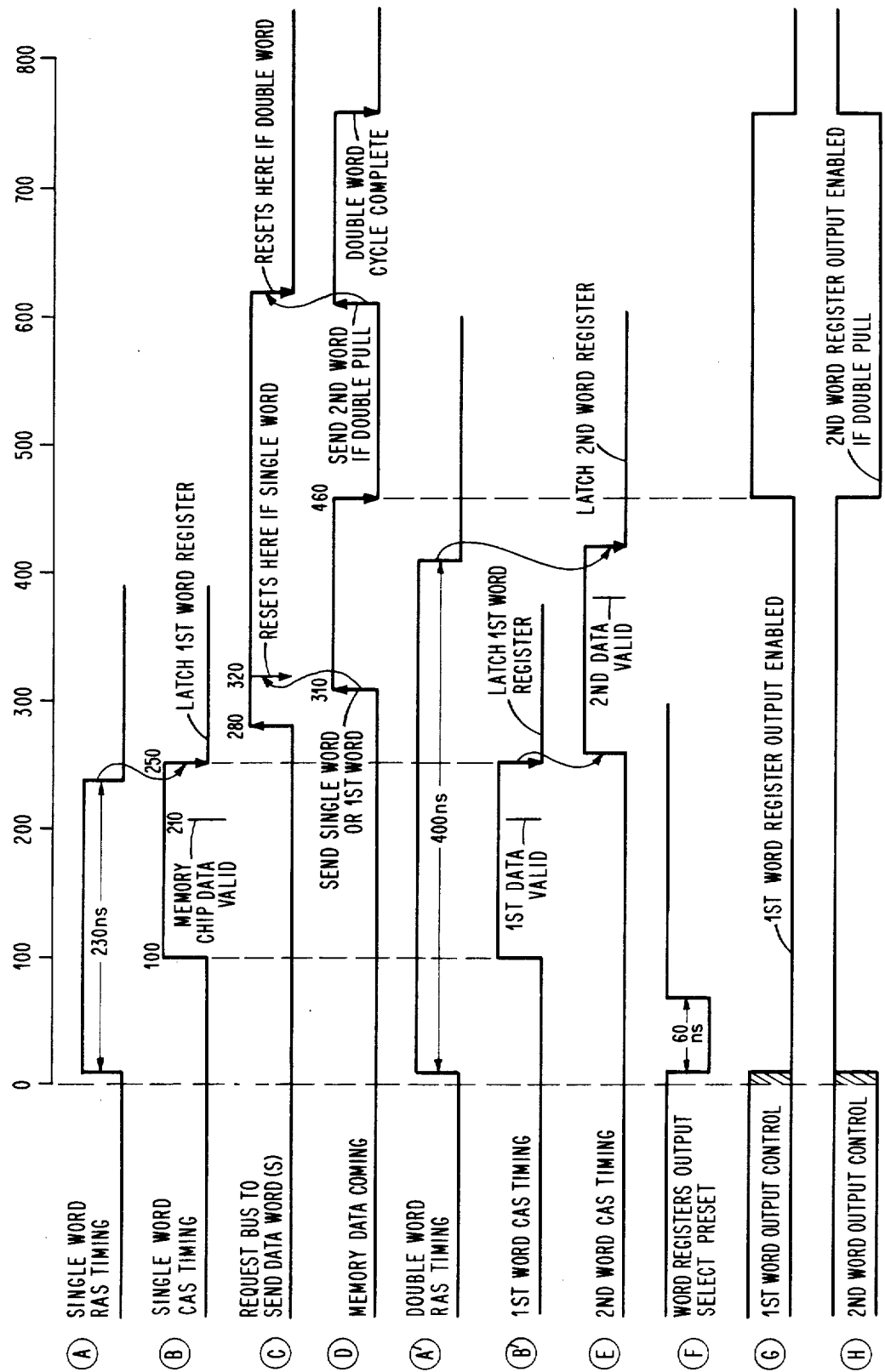
FIG. 4 is a timing diagram used in describing the operation of the present invention.

FIG. 4 illustrates diagrammatically the relationships between the different timing signals generated by the circuits of the present invention for processing double fetch memory requests. It will be assumed by way of example that the memory request specifies double fetch/pull memory read and that the memory address signals ADDLSB and ADDLSB+1 have the value "00". This means that the decoder 10-40 operates to select word blocks 0 and 1 by forcing signals DRAS0 and DRAS1 to binary ZEROS. These are the two blocks of memory which are to receive early and late column (CAS) timing signals. The state of least significant address bit ADDLSB determines the order in which the timing signals are applied to the preselected word blocks.

As seen from FIG. 4, in response to the memory request, the timing circuits 10-120 of FIG. 3 generate memory RAS timing signal which corresponds to waveform A or A'. That is, upon receipt of the request, a memory cycle is initiated by forcing memory cycle signal MEMCYC+00 to a binary ONE. This causes the delay line timing circuits 10-110 to generate a sequence of timing signals including DLYINN+00, DLY060+00, DLY80+00 and DLY160+00.

As seen from FIG. 3, since address signals ADDLSB and ADDLSB+1 are not both binary ONES, there is no address boundary condition. Hence, two words will be transferred to the bus interface. That is, the request causes flip-flop 10-125 to be set to a binary ONE which results in the generation of the stretched RAS timing signal of waveform A'.

As seen from FIG. 3, the MEMORY RAS TIMING signal is forced to a binary ONE by RAS timing OR gate 10-129 in response to timing signal DYLINN+00. Eighty nanoseconds after the start of signal DLYINN+00, the CAS timing AND gate 10-134 is conditioned by timing signal DLY80+00 to generate the FIRST WORD CAS TIMING signal which corresponds to waveform B' of FIG. 4. As seen from FIG. 1, the EARLY COLUMN CAS TIMING signal is applied selector circuit 10-6 and to AND gate 10-102 of FIG. 2. The selector circuit 10-6 is conditioned by signal ADDLSB to apply the CAS timing signal to the 256K DRAM chips of both blocks 0 and 2. However, since only the chips of block 0 were previously selected, the contents of a first word location specified by the block (row) and column memory addresses which were loaded into the chips in response to the RAS and CAS timing signals (i.e., waveform A' and B') are selected. As seen from waveform B' of FIG. 4, the data word contents accessed from the specified location are valid at 210 nanoseconds from the start of the memory cycle.

It will be noted that signals DLYINN+00 and DLY060+00 applied to the output word sequencer 10-8 at the start of the memory cycle, preset flip-flop 10-84 to a binary ONE as illustrated by waveform F of FIG. 4. This causes OR gate 10-88 to force the FIRST WORD OUTPUT CONTROL signal applied to the OE terminal of register 10-12 to a binary ZERO as shown by waveform G. At the same time, OR gate 10-86 is conditioned to force the SECOND WORD OUTPUT CONTROL signal applied to register 10-14 to a binary ONE as shown by waveform H.

When the circuits 10-110 switch timing signal DLYINN+00 to a binary ZERO, this in turn causes CAS timing AND gate 10-134 to switch the FIRST WORD CAS TIMING signal to a binary ZERO. As seen from waveform B', this conditions the first word register 10-12 to latch the data contents of the selected word location. Since the register 10-12 has already been enabled, the first word contents appear at the register output terminals.

Soon after the start of the memory cycle (i.e., at approximately 280 nanoseconds into the cycle), the bus interface circuits make a bus request to send the first word to the unit which initiated the memory request. This results in the generation of waveform C of FIG. 4. Upon receipt of an acknowledgement from the initiating unit, the bus interface circuits operate to generate waveform D of FIG. 4 which defines the interval during which the first data word is applied to the bus interface.

The termination of the FIRST WORD CAS TIMING signal permits CAS timing AND gate 10-138 to generate a SECOND WORD CAS TIMING signal in response to the STRETCH RAS TIMING signal as shown by waveform E. Additionally, the STRETCH RAS TIMING signal also operates to extend the interval of the MEMORY RAS TIMING signal from 230 nanoseconds to 400 nanoseconds as shown by waveform A' (i.e., sums timing signals DLY160+00 and DLYINN+00). The SECOND WORD CAS TIMING signal is applied to AND gate 10-104 and to selector circuit 10-6.

The selector circuit 10-6 in turn applies the late column timing signal to the 256K DRAM chips of blocks 1 and 3. However, since only block 1 was previously selected, the contents of the location in that block specified by the block/row and column addresses are read out from the stack. This second word is latched into register 10-14 at the end of the SECOND WORD CAS TIMING signal as shown by waveform E.

When the subsystem completes sending the first word to the interface, signals MEMORY DATA COMING and BUS DATA COMING are forced to binary ONES. As seen from FIG. 3, this causes NAND gate 10-82 to switch sequencer flip-flop 10-84 to a binary ZERO. As seen from waveforms G and H of FIG. 4, this switches the FIRST WORD and SECOND WORD OUTPUT CONTROL signals to a binary ONE and a binary ZERO, respectively. Thereafter, the second word latched in register 10-14 is transferred to the requesting unit in the same manner as described above.

It can be seen that when the least significant address bit signals ADDLSB and ADDLSB+1 are binary ONES, this causes RAS timing NAND gate 10-122 of FIG. 3 to force signal ADDRESS BOUND to a binary ZERO. This inhibits the setting of flip-flop 10-125 to a binary ONE which prevents the generation of the STRETCH RAS TIMING signal. Similarly, a memory read request for a single word (i.e., DOUBLE PULL is a ZERO) prevents the generation of a second CAS timing signal by inhibiting the setting of flip-flop 10-125 to a binary ONE.

In both instances, the MEMORY RAS TIMING signal is prevented from being stretched and the generation of a second CAS timing signal is not permitted to take place. Accordingly, only the first word read out from stack 10-2 is transferred to the requesting unit. The unit is also informed that a second word is not being transferred because of the address boundary condition. It has been found that in the case of the present embodiment it is more efficient to handle 75 percent of double word fetches rather than introducing delay into each memory cycle to satisfy a larger percentage of double word fetches. Moreover, it will be appreciated as the number of word blocks increases, there is a corresponding increase in efficiency.

From the above, it is seen how the apparatus of the present invention, without any loss of performance, is able to provide a double word fetch capability while eliminating the need to have a plurality of memory modules and a multiwide word interface including any connectors. In fact, in certain cases, system performance will increase as a result shortening the overall memory cycle except for double word fetches. This simplicity in interface construction and operation permits the utilization of smaller increments of memory at lower cost and facilitates expansion.

Many changes may be made to the preferred embodiment without departing from the teachings of the present invention. For example, the number of word blocks may be increased, the types of circuits changed, etc.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A memory subsystem for use in a system in which said subsystem couples to a single word bus for receiving memory requests and for transferring information words to said bus during bus cycles of operation, said memory requests including a multibit address different ones of said requests being coded to specify a predetermined type of memory read operation requiring a transfer of a plurality of words over successive bus cycles of operation, said memory subsystem comprising:

an addressable single word wide memory array including a plurality of word blocks of dynamic random access memory chips mounted on a single circuit board;

decode means coupled to said plurality of blocks of chips and to said bus to receive a number of least significant bits of each said address, said decode means being operative to generate a plurality of select signals, said select signals preselecting a corresponding plurality of word blocks in response to said number of least significant bits;

selection means coupled to said plurality of blocks of chips and to receive at least one of said number of least significant address bits;

a plurality of registers coupled in common to said single word wide memory array; and, timing means for generating a sequence of timing signals for each predetermined read type of read operation, said timing means being coupled to said memory array, to said selection means and to said plurality of registers, said sequence of timing signals including a first timing signal having a duration for defining a first interval and a plurality of sequential timing signals which occur during said first interval, said blocks of chips preselected by said select signals being enabled by said first timing signal for access during said first interval, said plurality of sequential timing signals being applied selectively by said selection means to different groups of blocks of chips as specified by said one least significant bit for enabling the read out of a plurality of words in succession during said first interval only from said blocks of said array preselected by said select signals and said plurality of registers being conditioned by said plurality of sequential signals to store said plurality of words in a predetermined sequence.

2. The subsystem of claim 1 wherein said timing means includes first logic circuit means coupled to receive said number of least significant address bits, and receive a signal from said bus indicative of said predetermined type of read operation, said logic circuit means being operative to generate an output signal when said number of least significant address bits have a value indicating a boundary condition, said output signal conditioning said timing means to inhibit extending said duration of said first timing signal and to inhibit the generation of certain ones of said plurality of timing signals which are generated during the extension of said first timing signal.

3. The subsystem of claim 2 wherein said first logic circuit means includes means operative to generate said output signal when said bus signal does not indicate said predetermined type of read operation.

4. The subsystem of claim 3 wherein said predetermined type of read operation causes said first logic circuit means to fetch at least a pair of words from successive word locations within said preselected word blocks.

5. The subsystem of claim 1 wherein said subsystem further includes output word sequencer means coupled to said plurality of registers, said timing means and to said bus, said sequencer means being preconditioned by other ones of said timing signals during the start of each memory operation for enabling each of said plurality of registers to transfer the stored words to said bus in the same proper sequence.

6. The subsystem of claim 5 wherein each of said plurality of registers has control and data inputs and outputs, said data inputs being connected in common to receive said plurality of sequential words read out from said memory array during one of said bus cycles, said outputs being connected in common to said single word bus and said control inputs being connected to said output word sequencer, said output word sequencer means being operative in response to said other ones of timing signals and signals from said bus to condition said plurality of registers to apply in succession, each of said plurality of words to said bus during successive bus cycles of operation.

7. The subsystem of claim 1 wherein said selection means includes a selector circuit having at least one control input, a plurality of inputs and outputs, said control input being connected to receive one of said number of said least significant bits, each of said plurality of inputs being connected to receive one of said plurality of sequential timing signals and each of said outputs being connected to a different group of said plurality of word blocks, said selector circuit being conditioned by said one of said number of said least significant bits to apply a different one of said plurality of sequential timing signals to each different group of word blocks for enabling said read out of said plurality of words in succession during said first interval.

8. The subsystem of claim 7 wherein said number of said least significant bits and said plurality of timing signals equal two and said selector circuit being operative to apply a first one of said plurality of timing signals to a first group of said blocks designated by said least significant bit for read out of a first word into a first one of said registers and to apply a second one of said plurality of timing signals to a second group of said blocks for read out of a second word into a second one of said registers.

9. The subsystem of claim 8 wherein said first and second groups of blocks include even numbered and odd numbered blocks respectively when said least significant bit is a binary ZERO.

10. A memory subsystem for use in a system in which said subsystem couples to a single word bus and receives memory requests, each request including a multibit address having first and second address portions, said subsystem comprising:

an addressable single word wide module including a plurality of word blocks of dynamic random access memory chips;

decode means coupled to said module and to said bus for receiving a plurality of least significant bits of each address coded to preselect a group of blocks within said plurality of blocks;

selector means coupled to said module and to said bus for receiving at least, a least significant bit of each address;

a plurality of registers coupled in common to said module; and, timing means for generating a sequence of timing signals in response to each predetermined type of request, said timing means being coupled to said module, to said selector means and to said plurality of registers, a first one of said timing signals enabling said chips of said preselected group of blocks to store said first address portion during a first interval and second and third ones of said timing signals causing said selector means to enable successively each of said plurality of blocks specified by said least significant bit to store said second address portion during said first interval for enabling the read out of words from only said preselected group of blocks in a predetermined sequence to said plurality of registers during said first interval.

11. The subsystem of claim 10 wherein said timing means includes first logic circuit means coupled to receive said plurality of least significant address bits, and receive a signal from said bus indicative of said predetermined type of request, said logic circuit means being operative to generate an output signal when said plurality of least significant address bits have a value indicating a boundary condition, said output signal conditioning said timing means to inhibit extending said duration of said first timing signal and to inhibit the generation of certain ones of said plurality of timing signals which are generated during the extension of said first timing signal.

12. The subsystem of claim 11 wherein said first logic circuit means includes means operative to generate said output signal when said bus signal does not indicate said predetermined type of request.

13. The subsystem of claim 12 wherein said predetermined type of request causes said first logic circuit means to fetch at least a pair of words from successive word locations within said preselected word blocks.

14. The subsystem of claim 10 wherein said subsystem further includes output word sequencer means coupled to said plurality of registers, said timing means and to said bus, said sequencer means being preconditioned by other ones of said timing signals during the start of each memory operation for sequentially enabling each of said plurality of registers to transfer the stored words to said bus in the proper sequence.

15. The subsystem of claim 14 wherein each of said plurality of registers has control and data inputs and outputs, said control input being connected to receive one of said number of said least significant bits, said plurality of data inputs being connected in common to receive said plurality of sequential words read out from said memory module during a single bus cycle, said outputs being connected in common to said single word bus and said control inputs being connected to said output word sequencer means, said output word sequencer means being operative in response to said other ones of timing signals and signals from said bus to condition said plurality of registers to apply in succession each of said plurality of words to said bus during successive bus cycles of operation.

16. The subsystem of claim 10 wherein said selector means includes a selector circuit having at least one control input, a plurality of inputs and outputs, each of said plurality of inputs being connected to receive said second and third ones of said timing signals and each of said outputs being connected to a different group of said plurality of word blocks, said selector circuit being conditioned by said one of said plurality of said least significant bits applied to said one control input to apply a different one of said plurality of timing signals to each different group of word blocks for said read out of said plurality of words.

17. The subsystem of claim 16 wherein said plurality of said least significant bits and said timing signals equal two, said selector circuit being operative to apply said first one of said plurality of timing signals to a first group of said blocks designated by said least significant bit for read out of a first word into a first one of said registers and to apply said second one of said timing signals to a second group of said blocks for read out of a second word into a second one of said registers.

18. The subsystem of claim 17 wherein said first and second groups of blocks correspond to even numbered and odd numbered blocks respectively when said least significant bit is a binary ZERO.

19. The method of organizing a memory subsystem which couples to a single word bus for receiving memory requests and for transferring words to said bus during successive bus cycles of operation, each said request including a multibit address having a least significant bit address portion, said method comprising the steps of:

mounting all of the word blocks of chips on a single board to provide a single word wide interface;

connecting decoder means to all of said word blocks of chips for preselecting a number of said blocks in response to said least significant bit address portion;

connecting timing means for generating a row address pulse and a number of sequential column address pulses within an interval defined by said row address pulse; and, connecting selector means to said timing means for applying said number of column address pulses to different sets of word block chips in a predetermined manner for enabling the sequential read out of a plurality of words during said interval from successive word locations within said preselected number of blocks to said single word wide interface.

20. The method of claim 19 wherein said method further includes the steps of:

connecting a plurality of registers in common to said interface;

connecting said timing means for applying a first one of said number of column address pulses to a first one of said registers; and, connecting said timing means for applying a second one of said number of column address pulses to a second one of said registers for storage of each word of said plurality of words sequentially read out from said preselected blocks of chips.

21. The method of claim 20 wherein said method further includes the step of connecting means for enabling said first and second ones of said registers in sequence by presetting said enabling means at the start of each memory cycle for transferring said plurality of words in the proper sequence to said bus over successive bus cycles of operation.

* * * * *